(12) United States Patent
Do et al.

(10) Patent No.: US 8,309,451 B2
(45) Date of Patent: Nov. 13, 2012

(54) SEMICONDUCTOR DEVICE AND METHOD OF PROVIDING COMMON VOLTAGE BUS AND WIRE BONDABLE REDISTRIBUTION

(75) Inventors: Byung Tai Do, Singapore (SG); Stephen A. Murphy, San Jose, CA (US); Yaojian Lin, Singapore (SG); Heap Hoe Kuan, Singapore (SG); Pandi Chelvam Marimuthu, Singapore (SG); Hin Hwa Goh, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 786 days.

(21) Appl. No.: 12/182,283

(22) Filed: Jul. 30, 2008

(65) Prior Publication Data

US 2009/0032975 A1  Feb. 5, 2009

Related U.S. Application Data

(60) Provisional application No. 60/952,789, filed on Jul. 30, 2007, provisional application No. 60/984,666, filed on Nov. 1, 2007.

(51) Int. Cl.
*H01L 23/49* (2006.01)
*H01L 21/44* (2006.01)

(52) U.S. Cl. ............... 438/612; 257/784; 257/E21.509; 257/E21.523; 257/E23.015; 257/E23.02; 438/617

(58) Field of Classification Search .............. 257/784, 257/E21.509, E21.523, E23.015, E23.02; 438/612, 617
See application file for complete search history.

(56) References Cited

U.S. PATENT DOCUMENTS

| | | | |
|---|---|---|---|
| 6,066,877 A * | 5/2000 | Williams et al. | 257/341 |
| 6,596,619 B1 | 7/2003 | Wang et al. | |
| 6,646,347 B2 * | 11/2003 | Sarihan et al. | 257/751 |
| 6,878,633 B2 | 4/2005 | Raskin et al. | |
| 6,888,246 B2 * | 5/2005 | Mercado et al. | 257/751 |
| 7,132,750 B2 | 11/2006 | Farnworth | |
| 7,535,103 B2 * | 5/2009 | Farrar | 257/750 |
| 2004/0070042 A1 * | 4/2004 | Lee et al. | 257/459 |
| 2005/0017358 A1 * | 1/2005 | Farnworth | 257/751 |
| 2005/0104217 A1 | 5/2005 | Narayan et al. | |
| 2007/0007640 A1 * | 1/2007 | Harnden et al. | 257/690 |

* cited by examiner

*Primary Examiner* — Peniel M Gumedzoe
(74) *Attorney, Agent, or Firm* — Robert D. Atkins; Patent Law Group: Atkins & Associates, P.C.

(57) ABSTRACT

A semiconductor wafer contains a plurality of semiconductor die. The wafer has contact pads formed over its surface. A passivation layer is formed over the wafer. A stress buffer layer is formed over the passivation layer. The stress buffer layer is patterned to expose the contact pads. A metal layer is deposited over the stress buffer layer. The metal layer is a common voltage bus for the semiconductor device in electrical contact with the contact pads. An adhesion layer, barrier layer, and seed layer is formed over the wafer in electrical contact with the contact pads. The metal layer is mounted to the seed layer. Solder bumps or other interconnect structures are formed over the metal layer. A second passivation layer is formed over the metal layer. In an alternate embodiment, a wirebondable layer can be deposited over the metal layer and wirebonds connected to the metal layer.

21 Claims, 13 Drawing Sheets

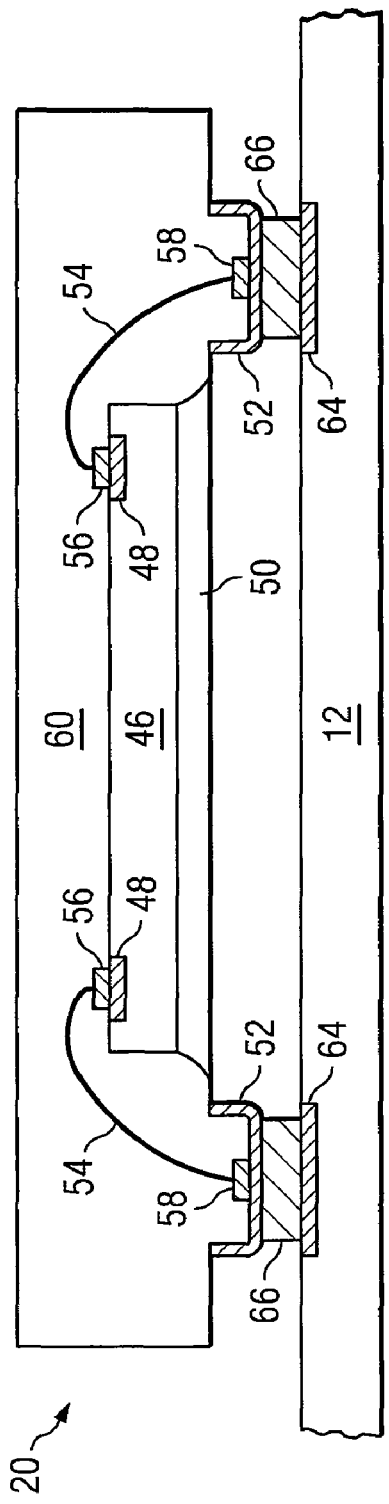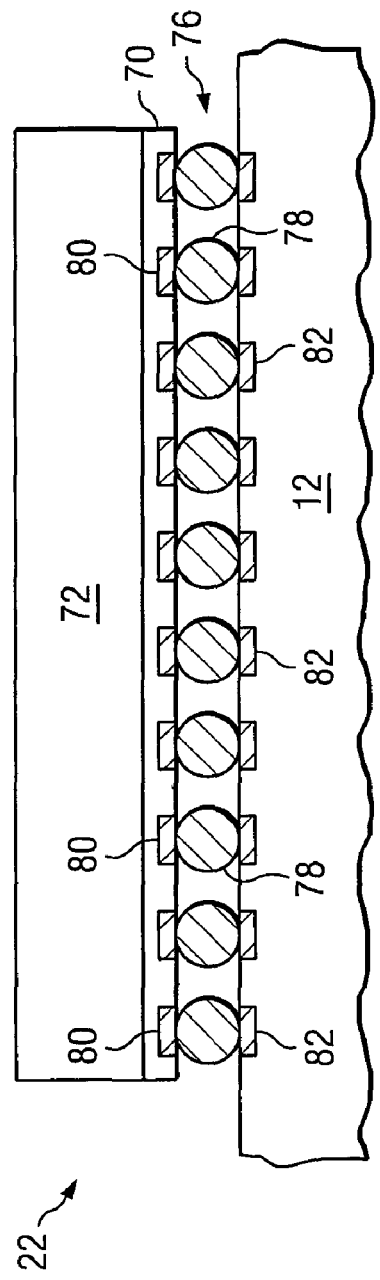

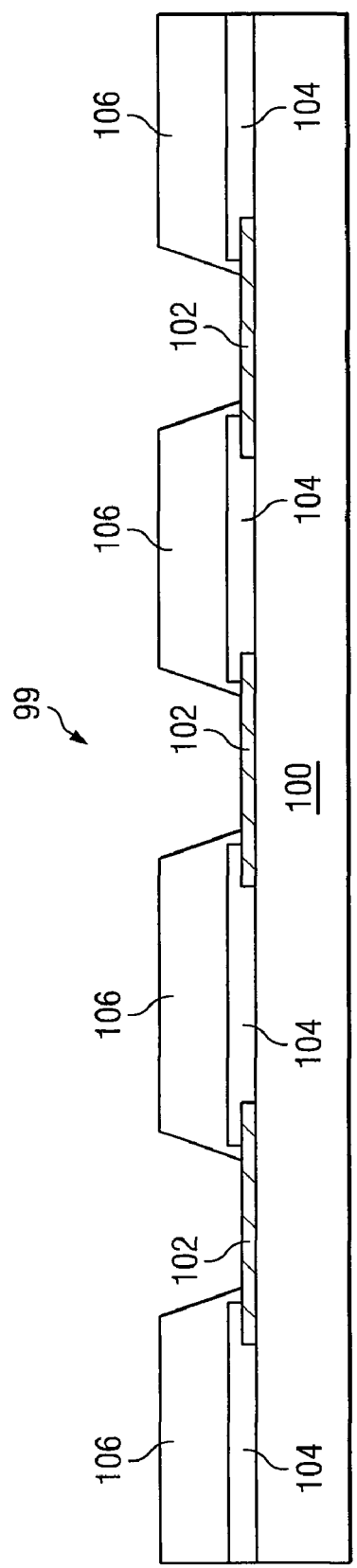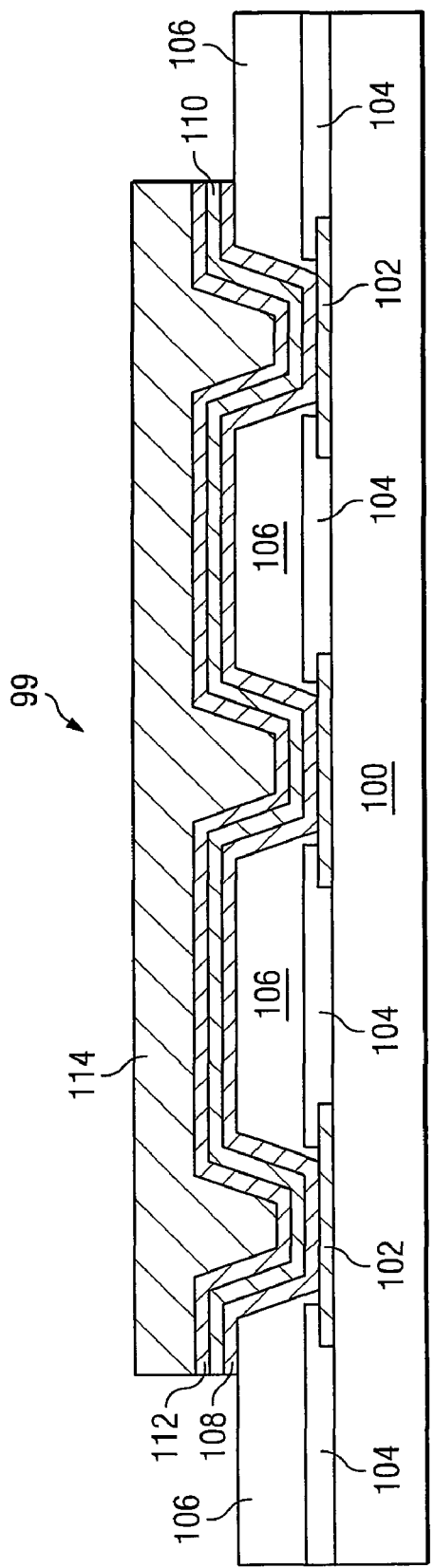

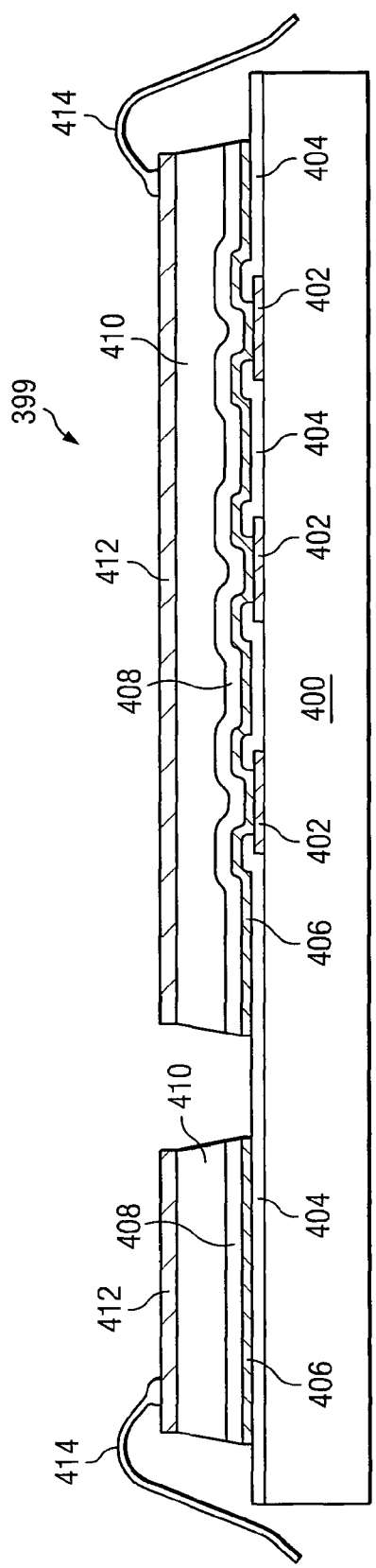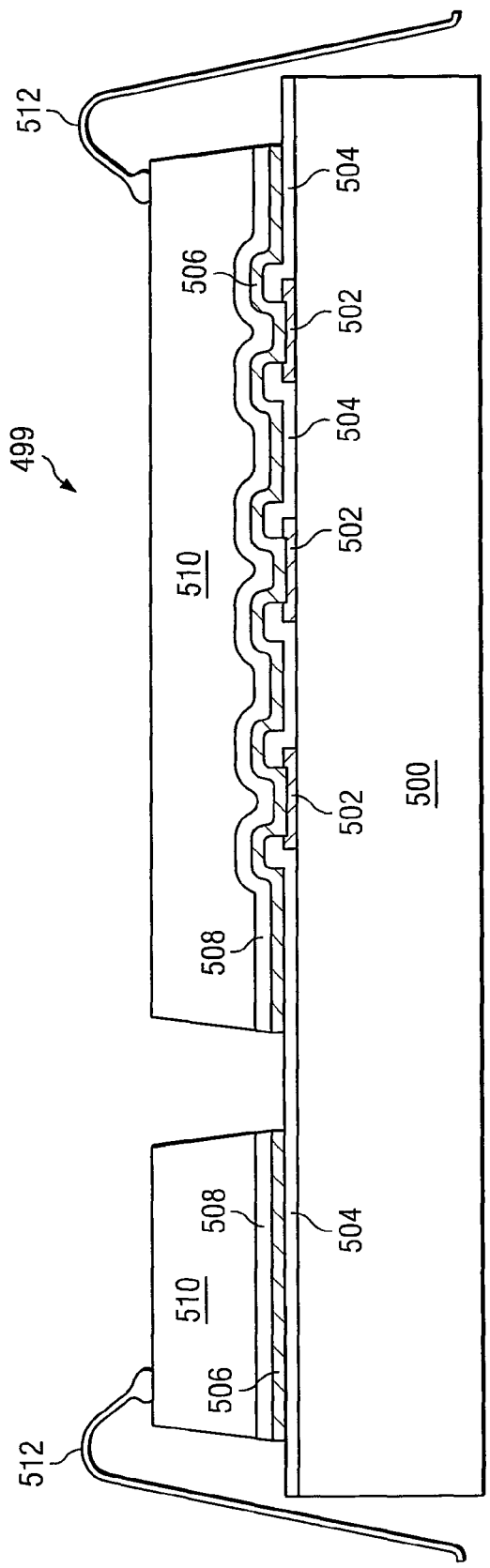

SEMICONDUCTOR DEVICE AND METHOD OF PROVIDING COMMON VOLTAGE BUS AND WIRE BONDABLE REDISTRIBUTION

CLAIM TO DOMESTIC PRIORITY

The present nonprovisional application claims the benefit of priority of U.S. Provisional Application Ser. No. 60/952,789, filed Jul. 30, 2007, and U.S. Provisional Application No. 60/984,666, filed Nov. 1, 2007.

FIELD OF THE INVENTION

The present invention relates in general to semiconductor devices and, more particularly, to a semiconductor device having large conductive buses or wirebondable regions.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

Semiconductor devices operate by exploiting the electrical properties of semiconductor materials. Generally, semiconductor materials have electrical properties that vary between those of conductors and insulators. In most cases, semiconductors have poor electrical conductivity, however their conductivity can be modified through the use of doping and/or applied electrical fields. Doping involves introducing impurities into the semiconductor material to adjust its electrical properties. Depending on the amount of doping performed, semiconductor materials may be permanently modified to conduct electricity as well as other conductors or to act as insulators. The application of electric fields also modifies the conductivity of semiconductor materials by modifying the distribution of conductive particles within the material. Through doping and the application of electronic fields, integrated circuits are formed and operated over a semiconductor substrate. The circuits include multiple layers of semiconductor, insulator and conductive materials.

Because the electrical properties of semiconductor materials may be altered by the application of electric fields, they can be used to manufacture both passive and active circuit elements. Passive circuit elements include capacitors, inductors, resistors and other circuit elements that are not capable of power gain. Active circuit elements, however, include transistors and allow for the creation of circuits that can both amplify and switch electrical signals. Transistors are the fundamental elements of modern computing systems and allow for the formation of logic circuits that include complex functionality and provide high performance.

Many transistors can be combined into a single integrated circuit formed over a semiconductor wafer or substrate. Integrated circuits combine many transistors and other passive and active circuit elements over a single substrate to provide complex electronic circuits such as processors, microcontrollers, digital signal processors, and memory systems. Modern integrated circuits may include tens of millions of transistors and provide the complex functionality of all computing systems. Integrated circuits and other semiconductor devices in electronic systems provide high performance in a small area and may be created using cost-efficient manufacturing processes.

The manufacture of semiconductor devices and integrated circuits involves formation of a wafer having a plurality of die. Each semiconductor die contains transistors and other active and passive circuit elements performing a variety of electrical functions. For a given wafer, each die from the wafer typically performs the same electrical function. Semiconductor devices are formed in two steps referred to as front-end and back-end manufacturing that involve formation of the die and packaging for an end user.

Front-end manufacturing generally refers to formation of the semiconductor devices on the wafer. During formation of the devices, layers of a dielectric material such as silicon dioxide are deposited over the wafer. The dielectric facilitates the formation of transistors and memory circuits. Metal layers are deposited over the wafer and patterned to interconnect the various semiconductor devices. The finished wafer has an active side containing the transistors and other active and passive components. After the devices are formed, they are tested in a preliminary testing step to verify the devices are operational. If a sufficiently high number of devices are discovered to contain defects, the devices or even the entire wafer may be discarded.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device. After singulation, the individual dies are mounted to a package substrate that includes pins or contact pads for interconnection with other system components. Contact pads formed over the semiconductor die are then connected to contact pads within the package. Often, wire bonding is used to make the connection, however other connection technologies such as solder bumps or stud bumping may be used. After wire bonding, an encapsulant or other molding material is deposited over the package to provide physical support and electrical insulation. The finished package is then inserted into an electrical system and the functionality of the semiconductor device is made available to the other system components.

One goal of semiconductor manufacturing is to produce a package suitable for faster, reliable, smaller, and higher-density integrated circuits at lower cost. Flip chip packages or wafer level packages are ideally suited for integrated circuits demanding high speed, high density, and greater pin count. Flip chip style packaging involves mounting the active side of the die face down toward a chip carrier substrate or printed circuit board (PCB). The electrical and mechanical interconnect between the circuit elements on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active circuit elements on the die to the carrier substrate in order to reduce signal propagation distance, lower capacitance, and achieve overall better circuit performance.

Often the semiconductor package includes dies having common voltage buses. The buses include conductive materials such as copper formed over a relatively large area. Although the buses allow for several die interconnections having the same common voltage, the large area of thick conductive material generates high levels of residue stress.

The stress can cause damage to the IC active circuitry and general package reliability problems.

In conventional packages, contact pads are formed over the package for electrical interconnect. Often the interconnect is formed using wirebonds connected to contact pads formed over the package. The formation of conventional wirebond interconnect structures requires high-cost front end wafer processing including chemical mechanical polishing (CMP), chemical vapor deposition (CVD) and reactive ion etching (RIE) to form the rerouted peripheral input/output pads for wire bonding. The formation of peripheral input/output pads is expensive and results in a package having a relatively large footprint.

SUMMARY OF THE INVENTION

In one embodiment, the present invention is a method of making a semiconductor device comprising providing a wafer having a plurality of semiconductor die. The wafer has contact pads formed over a surface of the wafer. The method includes forming a passivation layer over the wafer, and forming a stress buffer layer over the passivation layer. The stress buffer layer is patterned to expose the contact pads. The method includes depositing a metal layer over the stress buffer layer. The metal layer provides a common voltage bus for the semiconductor device and is in electrical communication with the contact pads. The method includes forming an interconnect structure over the metal layer.

In another embodiment, the present invention is a method of making a semiconductor device comprising providing a wafer having a plurality of semiconductor die. The wafer has contact pads formed over a surface of the wafer. The method includes forming a passivation layer over the wafer. The passivation layer is patterned to expose the contact pads. The method includes forming an adhesion layer over the wafer, and forming a seed layer over the adhesion layer. The seed layer is in electrical communication with the contact pads. The method includes depositing a photoresistive material over the wafer, and plating a metal layer over the wafer. The metal layer is patterned in accordance with the photoresistive material. The method includes removing the photoresistive material, etching a portion of the seed layer and the adhesion layer to expose a portion of the passivation layer, depositing a wirebondable layer over the metal layer, and connecting wirebonds to the wirebondable layer.

In another embodiment, the present invention is a method of making a semiconductor device comprising providing a semiconductor die, and forming a seed layer over the semiconductor die. The seed layer is in electrical communication with contact pads of the semiconductor die. The method includes plating a metal layer over the semiconductor die. The metal layer provides a common voltage bus for the semiconductor device. The method includes connecting wirebonds to the metal layer.

In another embodiment, the present invention is a semiconductor device comprising a semiconductor die, and a seed layer formed over the semiconductor die. The seed layer is in electrical communication with a contact pad of the semiconductor die. The semiconductor device includes a metal layer plated over the semiconductor die. The metal layer provides a common voltage bus for the semiconductor device. The semiconductor device includes wirebonds connected to the metal layer.

BRIEF DESCRIPTION OF THE DRAWINGS

FIGS. 2a-2d illustrate further detail of the semiconductor packages mounted to the PCB;

FIGS. 3a-3d illustrate a method of forming a semiconductor device having a common voltage bus formed over a stress buffer layer;

FIG. 10 illustrates a semiconductor device with a wirebondable layer formed over a top surface of a main metallization layer; and FIG. 11 illustrates a semiconductor device having a main metallization layer that is used as a bondable surface for wirebonds.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive circuit elements performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
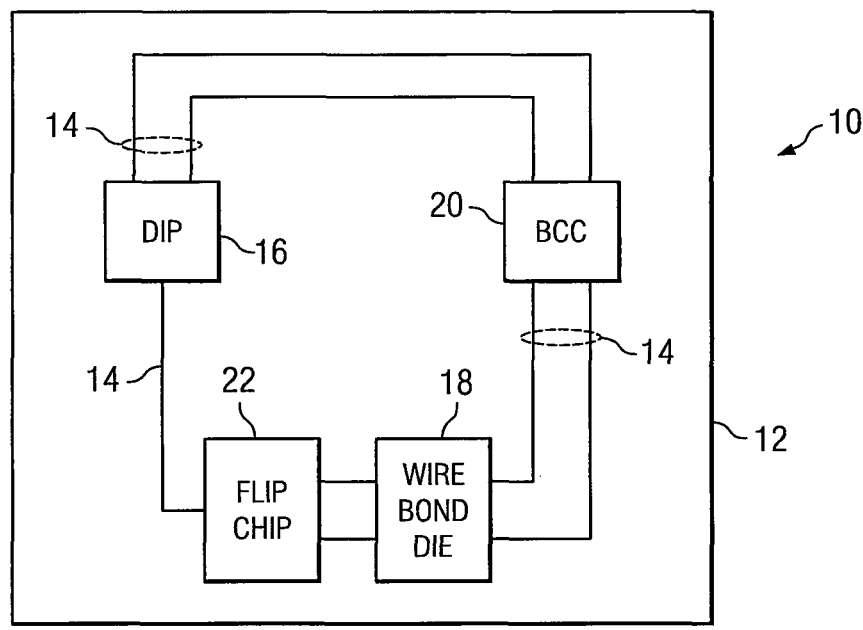
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete circuit elements, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
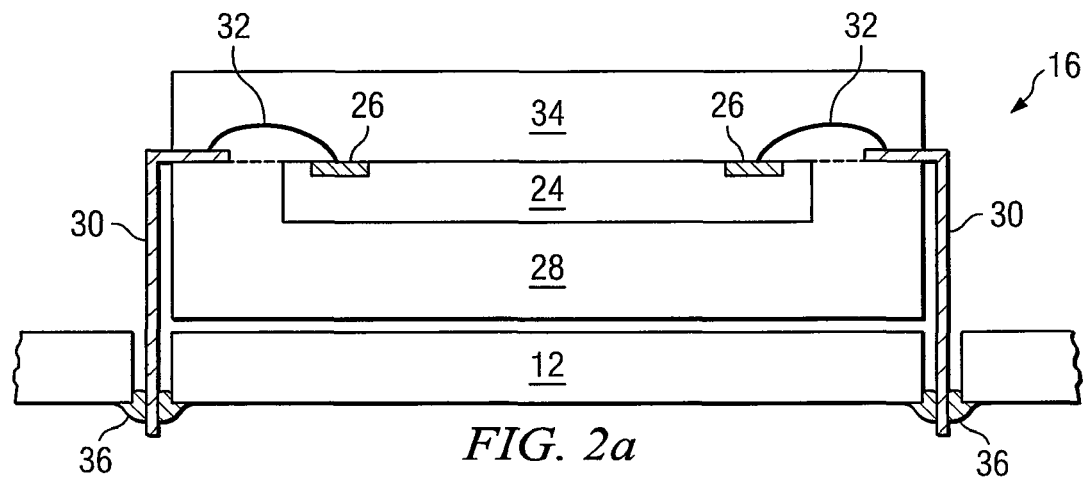

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process.

During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
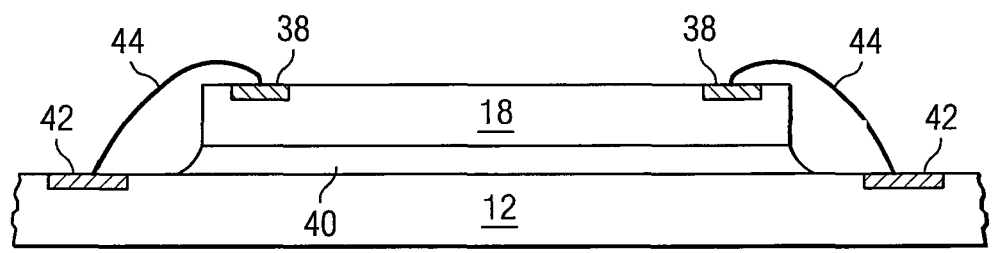

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

FIGS. 3a-3d illustrate a method of forming semiconductor device 99 having a common voltage bus formed over a stress buffer layer. Wafer 100 includes silicon (Si), gallium arsenide (GaAs) or other substrate material. Circuit elements are formed over wafer 100. The circuit elements may be active or passive and include resistors, capacitors, transistors, and inductors. The circuit elements are made up of patterned conductive, resistive, and dielectric layers and are formed using wafer-level fabrication processes as described above. In one embodiment, wafer 100 includes an IC power device wafer and includes one or more power circuit elements formed over wafer 100. Contact pads or final metal pads 102 are formed over wafer 100 using a physical vapor deposition (PVD), chemical vapor deposition (CVD), electrolytic plating, or electroless plating process. Contact pads 102 are made with a conductive material such as Al, Cu, tin (Sn), Ni, Au, or Ag, and are electrically connected to the circuit elements formed over wafer 100. Passivation 104 is formed over wafer 100 and contact pads 102. Passivation 104 is patterned or etched to expose contact pads 102 and includes an insulation material such as polyimide, benzocyclobutene (BCB), polybenzoxazoles (PBO), epoxy based insulating polymer, or other insulating polymer materials. Passivation 104 provides physical support and electrical insulation. Stress buffer layer 106 is formed over passivation 104 and wafer 100. In one embodiment, stress buffer layer 106 is coated and patterned over a surface of wafer 100. Stress buffer layer 106 includes polyimide, BCB, PBO, epoxy based polymer materials or other insulating buffer materials. Stress buffer layer 106 is patterned to expose contact pads 102.

Turning to FIG. 3b, common voltage bus 114 is mounted over stress buffer layer 106. To mount common voltage bus 114, adhesion layer 108 is deposited over the stress buffer layer 106 in a conformal coating and includes titanium (Ti), titanium tungsten (TiW), tantalum (Ta), tantalum nitride (TaN), chromium (Cr), Al, or another electrically conductive adhesion material. Adhesion layer 108 is electrically connected to contact pads 102 through the etched portions of stress buffer layer 106. Barrier layer 110 is patterned and deposited over adhesion layer 108 in a conformal coating. Barrier layer 110 includes nickel vanadium (NiV), chrome copper (CrCu), TaN, titanium nitride (TiN), Ni, or other conductive barrier materials. Seed layer 112 is patterned and deposited over barrier layer 110 in a conformal coating. Seed layer 112 includes Al, aluminum alloy, Cu, Au, or other conductive materials.

Common voltage bus 114 is deposited and patterned over seed layer 112. Common voltage bus 114 may be deposited and patterned with selective plating or an etch-back process and includes Al, aluminum alloy, Cu, Au, or other conductive materials. Common voltage bus 114 includes a single conductive element and is mounted in electrical communication with contact pads 102 and any circuit elements formed over wafer 100 that are connected to contact pads 102. External voltage sources may be connected to common voltage bus 114 to supply power or ground (for example, +5 volts or 0 volts) to contact pads 102 and the circuit elements. Similarly, signal sources may be connected to common voltage bus 114 to supply a signal to a plurality of the circuit elements of wafer 100. Accordingly, common voltage bus 114 provides a relatively large-area conductive structure that allows for one or more external energy supplies to be connected to semiconductor device 99 and placed in electrical communication with a plurality of contact pads formed over wafer 100. Alternatively, in a logic circuit, for example, common voltage bus 114 can be used to combine the outputs of a plurality of contact pads. Furthermore, because common voltage bus 114, adhesion layer 108, barrier layer 110, and seed layer 112 are mounted over stress buffer layer 106, semiconductor device 99 is protected from residue stress generated within device 99.

As semiconductor device 99 operates, circuit elements with device 99 generate heat and change shape. Circuit elements and other components made from different materials expand and contract at different rates causing physical stresses within device 99. In conventional semiconductor devices, these stresses can cause components to fail. In the present embodiment, however, stress buffer layer 106 provides a relatively flexible intermediary structure to absorb and dampen stresses that are generated as semiconductor device 99 operates and generates heat, causing wafer 100 and common voltage bus 114 to expand and/or contract.

In alternative embodiments, different combinations of conductive layers are deposited between common voltage bus 114 and contact pads 102. For example, barrier layer 110 is optional and may not be included in device 99. In a further embodiment, seed layer 112 and common voltage bus 114 include the same electrically conductive material such as Cu or Al.

Figure 3C:
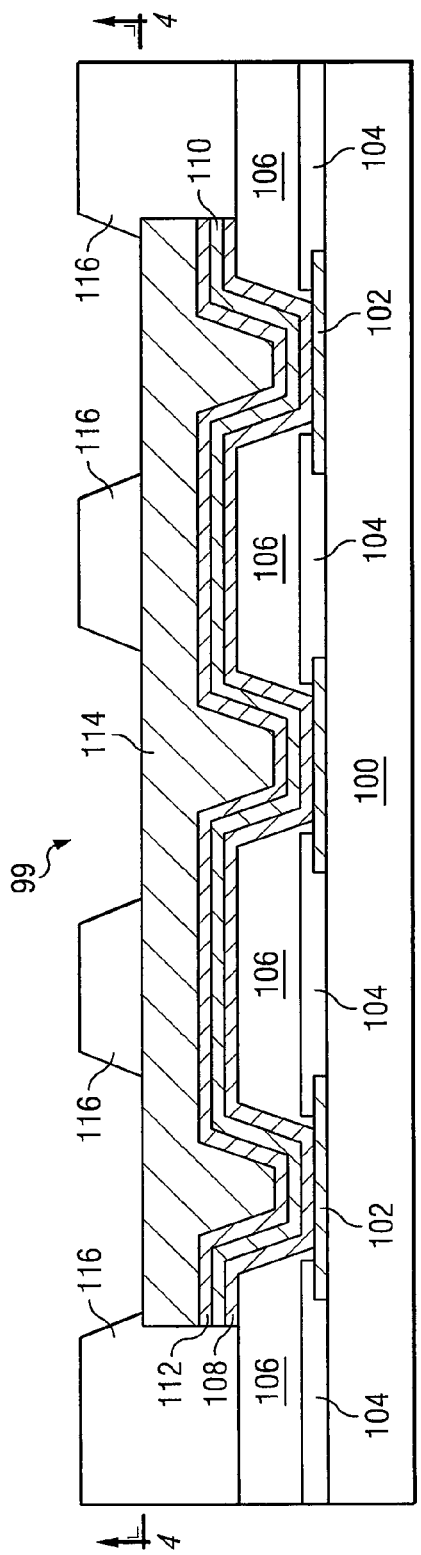

Turning to FIG. 3c, passivation 116 is coated and patterned over common voltage bus 114 and wafer 100. Passivation 116 provides physical support and electrical isolation to semiconductor device 99 and includes polyimide, BCB, PBO, epoxy based polymer materials or other electrically insulative materials. Passivation 116 is patterned to expose portions of common voltage bus 114.

Figure 3D:
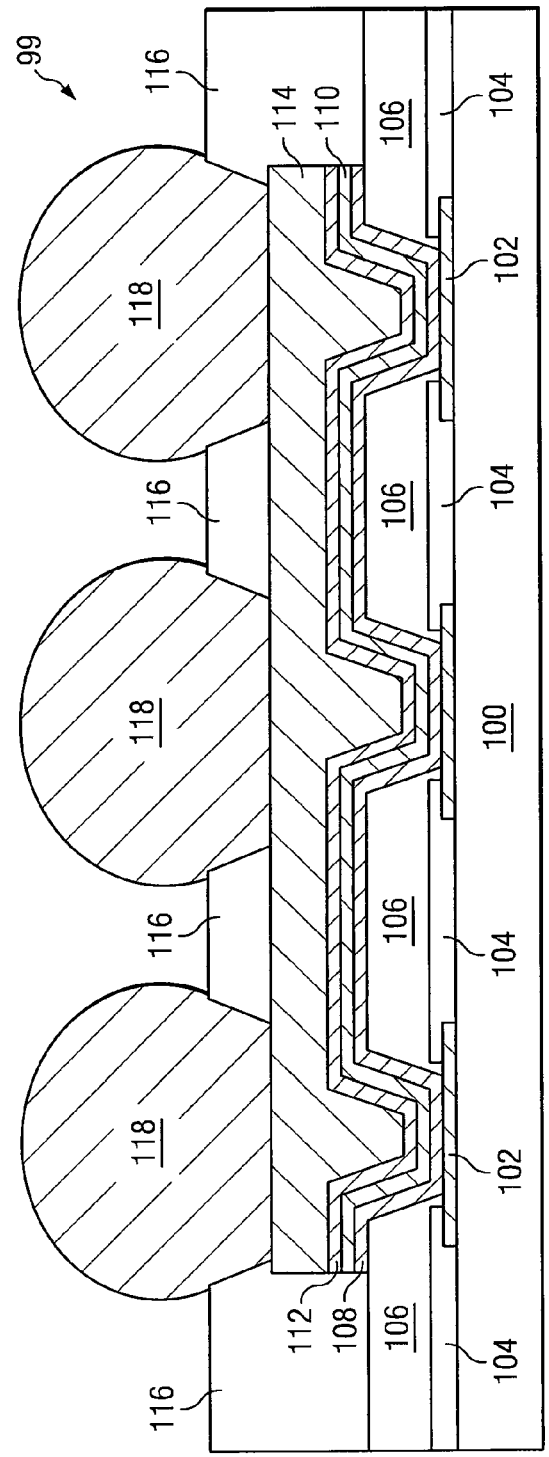

Turning to FIG. 3d, bumps 118 are connected to common voltage bus 114 over the openings of passivation 116. Bumps 118 are formed by a reflow process applied to a conductive solder material deposited over common voltage bus 114. Bumps 118 include Au, or Cu structures or another conductive material such as tin/lead (Sn/Pb), copper/zinc (CuZn), or copper/silver (CuAg) solder each containing an optional flux material. The solder material is deposited using a ball drop, stencil printing, and/or plating process. In alternative embodiments, bumps 118 may be replaced with wirebonds or other interconnect structures for connecting external components to common voltage bus 114. In alternative embodiments, wirebonds are connected directly to a surface of common voltage bus 114. Common voltage bus 114 may include an optional wirebondable layer formed over a surface of common voltage bus 114 to facilitate the formation of wirebond interconnects.

Figure 4:
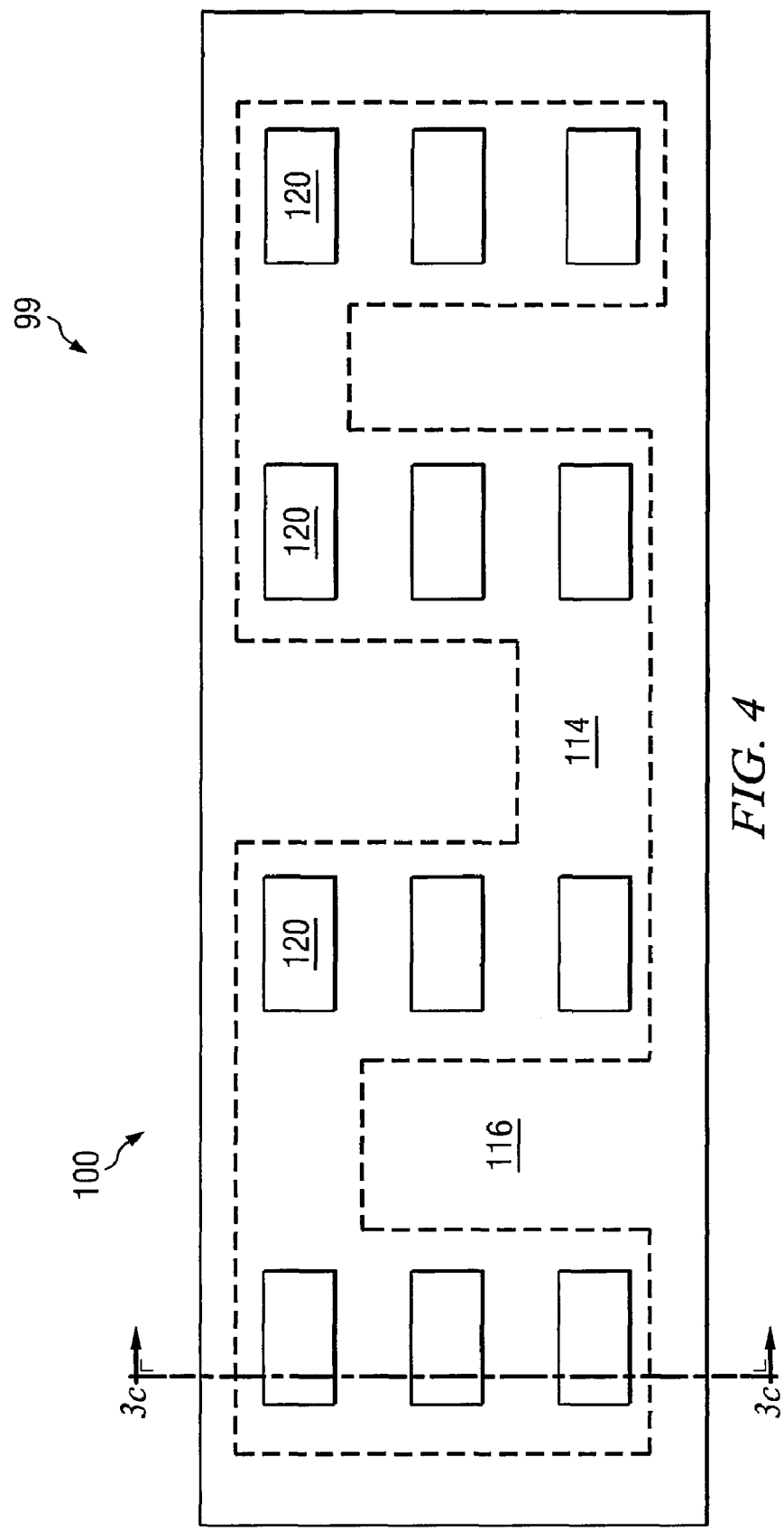
FIG. 4 illustrates a cross-sectional view of the device of FIG. 3c taken along plane 4 of FIG. 3c showing passivation formed over a common voltage bus.

FIG. 4 illustrates a cross-sectional view of semiconductor device 99 taken along plane 4 of FIG. 3c. Passivation 116 is deposited over wafer 100. Passivation 116 includes polyimide, BCB, PBO, epoxy based polymer materials or other electrically insulative materials and is etched to form windows 120 which expose portions of common voltage bus 114. Common voltage bus 114 lays in a plane beneath passivation 116 and is shown on FIG. 4 with dashed lines. Bumps or other interconnection devices may be mounted over windows 120 and electrically connected to common voltage bus 114. Common voltage bus 114 takes any appropriate shape depending upon the application or circuit design considerations. For example, common voltage bus 114 may be spiral shaped, U shaped, N shaped, or zig-zag shaped.

Using these methods, a semiconductor device is manufactured having improved yield and reliability. The device includes a stress buffer layer formed between the large area common voltage bus and the active circuit formed over the semiconductor wafer. The common voltage bus provides a single conductive structure that is connected to a plurality of contact pads of a semiconductor device. A single external energy supply may be connected to the common voltage bus to apply a voltage to a plurality of contact pads, for example. The stress buffer layer minimizes the stress generated as the semiconductor device operates and various circuits elements or other components of the semiconductor device expand and contract. For example, stresses generated by the large area common voltage bus and the wafer are minimized by the stress buffer layer. Accordingly, the stress buffer layer improves device yield and reliability of the final product.

Figure 5A:
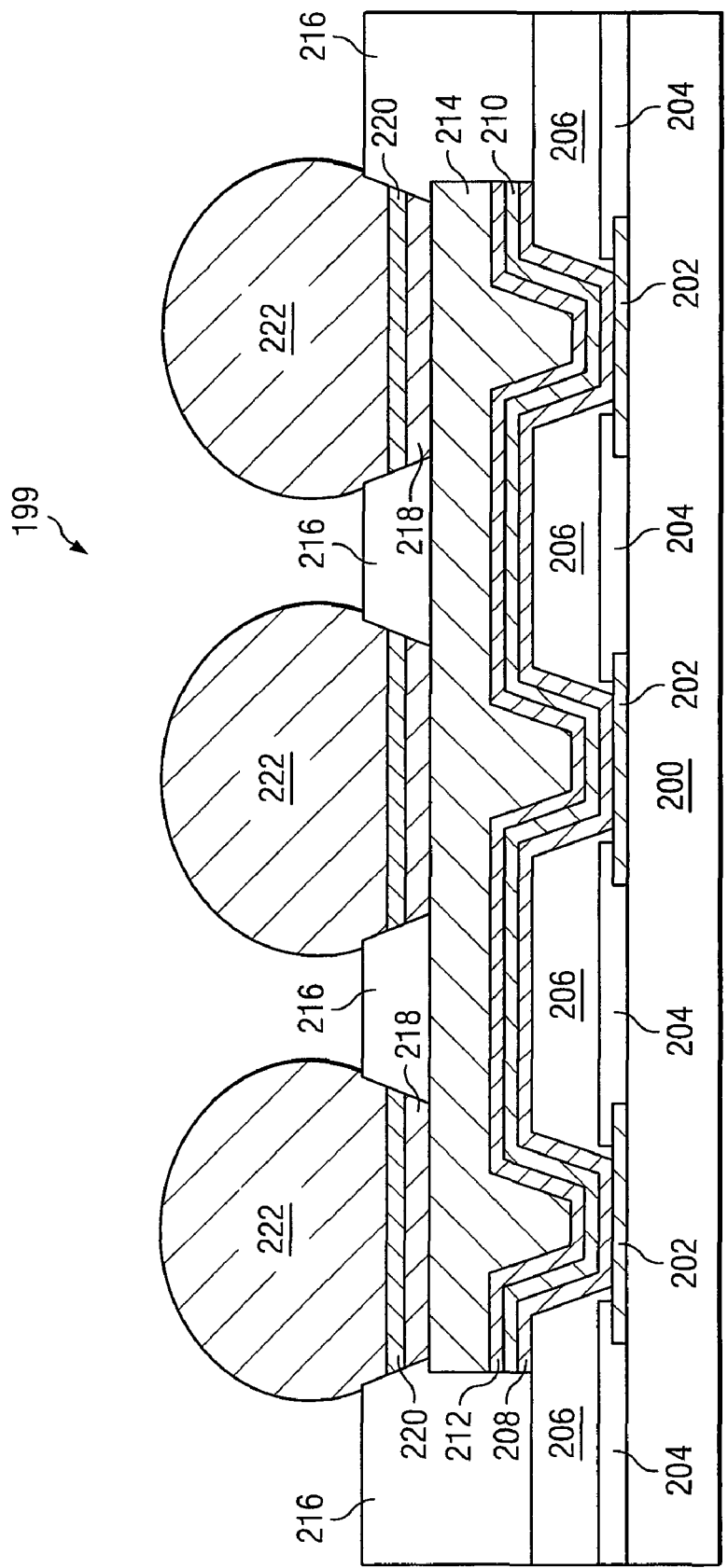
FIGS. 5a-5b illustrate a semiconductor device having a common voltage bus formed over a stress buffer layer, interconnect bumps and under-bump metallization (UBM) are formed over the device.
Figure 5B:
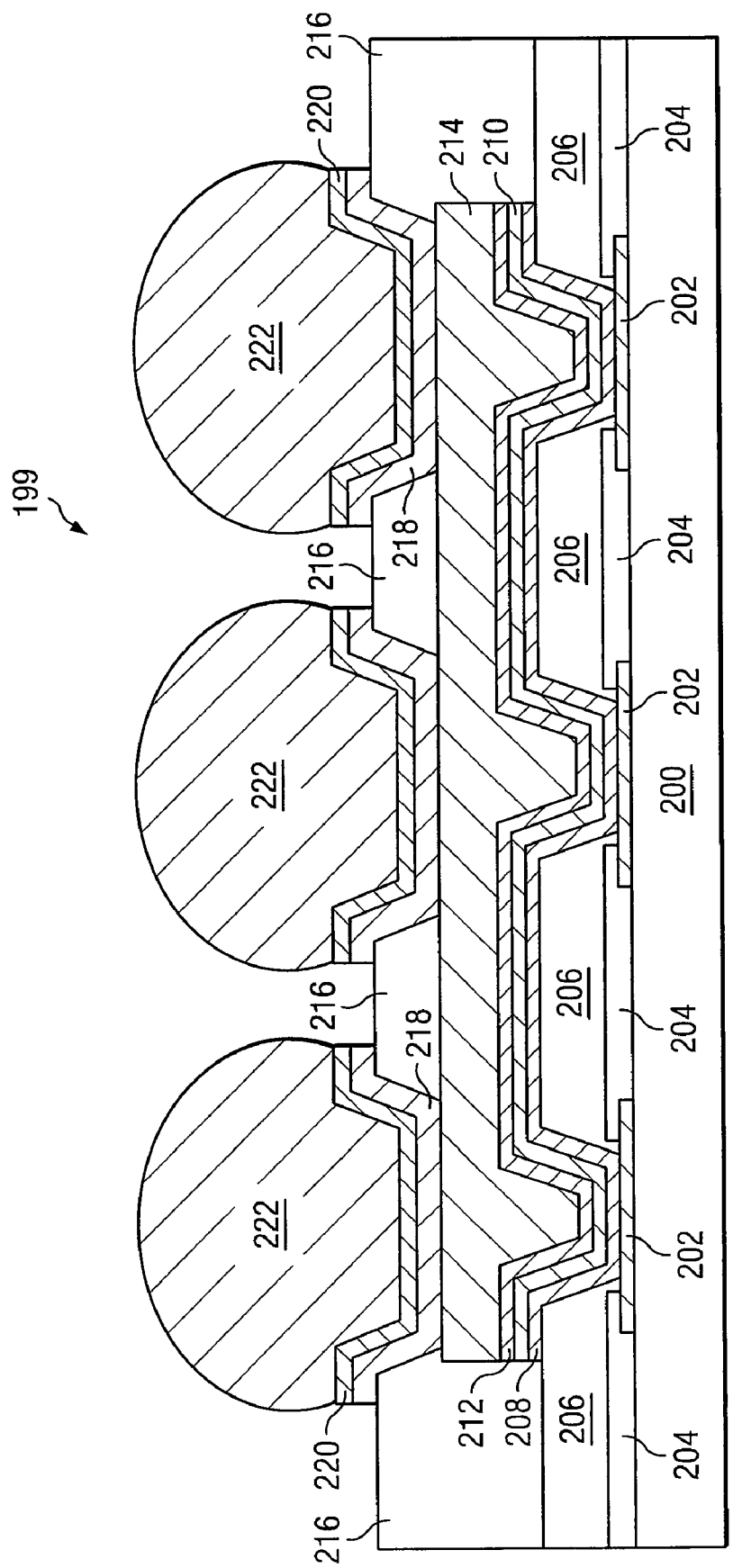

FIGS. 5a-5b illustrate semiconductor device 199 having a common voltage bus and under-bump metallization (UBM). Wafer 200 includes Si, GaAs or other substrate material. In one embodiment, wafer 200 includes an IC power device wafer and includes one or more power circuit elements formed over wafer 200. Contact pads or final metal pads 202 are formed over wafer 200 using a PVD, CVD, electrolytic plating, or electroless plating process. Contact pads 202 are made with a conductive material such as Al, Cu, Sn, Ni, Au, or Ag, and are electrically connected to the circuit elements formed over wafer 200. Passivation 204 is formed over wafer 200 and contact pads 202. Passivation 204 is patterned or etched to expose contact pads 202 and includes an insulation material such as polyimide, BCB, PBO, epoxy based insulating polymer, or other insulating polymer materials. Stress buffer layer 206 is formed over passivation 204 and wafer 200. In one embodiment, stress buffer layer 206 is coated and patterned over a surface of wafer 200. Stress buffer layer 206 includes polyimide, BCB, PBO, epoxy based polymer materials or other insulating buffer materials. Stress buffer layer 206 is patterned to expose contact pads 202.

Adhesion layer 208 is deposited over wafer 200 in a conformal coating and includes Ti, TiW, Ta, TaN, Cr, Al, or another electrically conductive adhesion material. Adhesion layer 208 is electrically connected to contact pads 202. Barrier layer 210 is patterned and deposited over adhesion layer 208 in a conformal coating. Barrier layer 210 includes NiV, CrCu, TaN, TiN, Ni, or other conductive barrier materials. Seed layer 212 is patterned and deposited over barrier layer 210 in a conformal coating. Seed layer 212 includes Al, aluminum alloy, Cu, Au, or other conductive materials. Common voltage bus 214 is formed over seed layer 212. Common voltage bus 214 may be deposited and patterned with selective plating or an etch-back process. In alternative embodiments, different combinations of conductive layers may be deposited between common voltage bus 214 and contact pads 202. For example, barrier layer 210 is optional and may not be included in semiconductor device 199. In a further embodiment, seed layer 212 and common voltage bus 214 include the same electrically conductive material. Passivation 216 is coated and patterned over common voltage bus 214 and wafer 200. Passivation 216 provides physical support and electrical isolation to semiconductor device 199 and includes polyimide, BCB, PBO, epoxy based polymer materials or other electrically insulative materials. Passivation 216 is patterned or etched to expose portions of common voltage bus 214.

Barrier layer 218 is formed over the exposed portions of common voltage bus 214 using a PVD, CVD, electrolytic plating, electroless plating, or other deposition process. Barrier layer 218 includes Ni, palladium (Pd), platinum (Pt), or other conductive material. Wetting layer 220 is deposited over barrier layer 218 and includes Au, Ag, Cu or another conductive material. As shown in FIG. 5a, both barrier layer 218 and wetting layer 220 are deposited within the opening formed in passivation 216. However, in an alternative embodiment, as shown in FIG. 5b, barrier layer 218 and wetting layer 220 are deposited to overlap the opening formed in passivation 216.

Bumps 222 are deposited over and electrically connected to wetting layer 220. Bumps 222 are formed over the openings of passivation 216 and include a conductive material. Bumps 222 are formed by a reflow process applied to solder material deposited over common voltage bus 214. Bumps 222 include Au, or Cu structures or another conductive material such as Sn/Pb, CuZn, or CuAg solder each containing an optional flux material. The solder material is deposited using a ball drop, stencil printing, and/or plating process. Together barrier layer 218 and wetting layer 220 form a UBM structure to facilitate the deposition of bumps 222 and enhance the physical and electrical connection between bumps 222 and common voltage bus 214.

Figure 6:
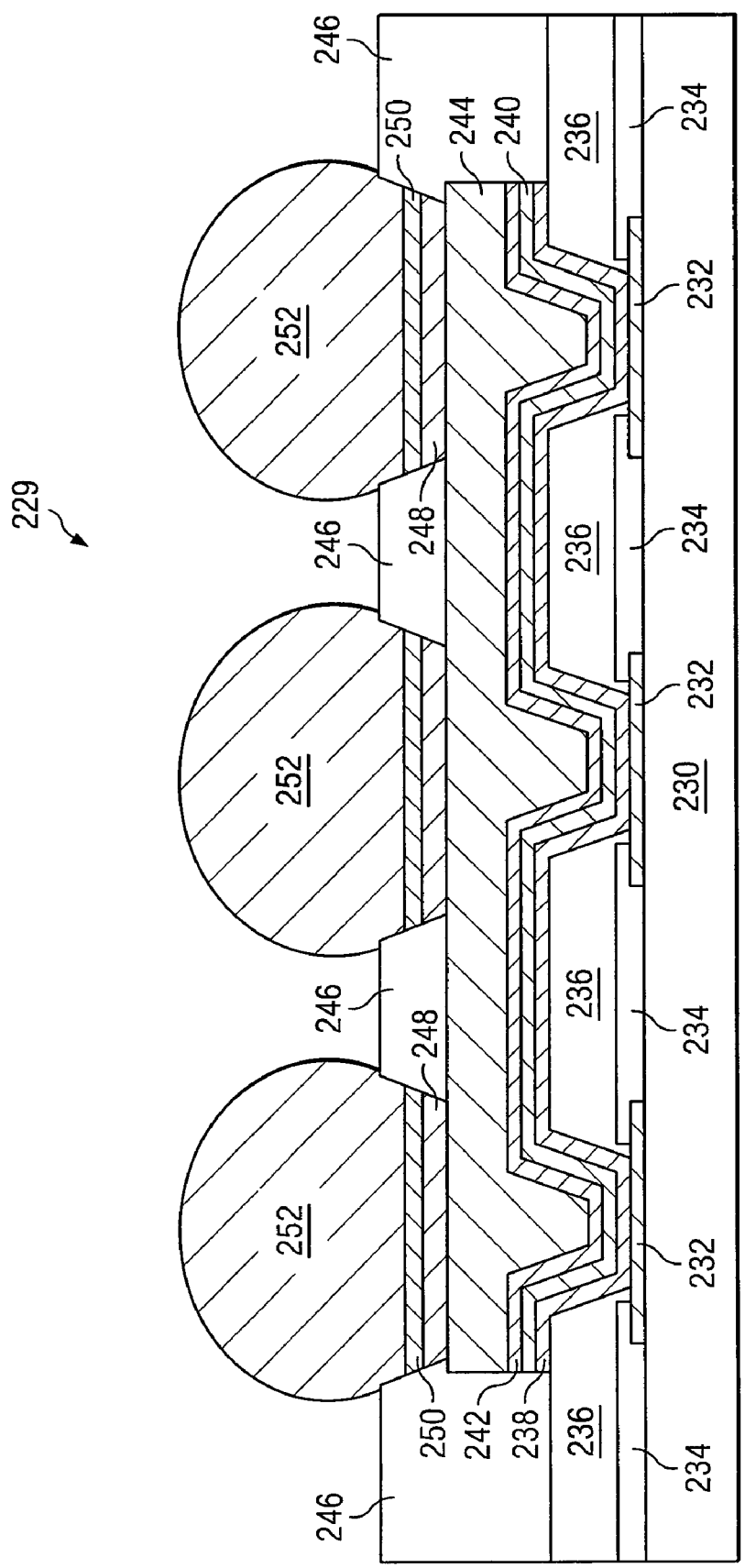
FIG. 6 illustrates a semiconductor device having a common voltage bus formed over a stress buffer layer, interconnect bumps are formed over a barrier and seed layer of the semiconductor device.

FIG. 6 illustrates semiconductor device 229 having a common voltage bus formed over a stress buffer layer, interconnect bumps are formed over a barrier and seed layer of semiconductor device 229. Wafer 230 includes Si, GaAs or other substrate material. In one embodiment, wafer 230 includes an IC power device wafer and includes one or more power circuit elements formed over wafer 230. Contact pads or final metal pads 232 are formed over wafer 230 using a PVD, CVD, electrolytic plating, or electroless plating process. Contact pads 232 are made with a conductive material such as Al, Cu, Sn, Ni, Au, or Ag, and are electrically connected to the circuit elements formed over wafer 230. Passivation 234 is formed over wafer 230 and contact pads 232. Passivation 234 is patterned or etched to expose contact pads 232 and includes an insulation material such as polyimide, BCB, PBO, epoxy based insulating polymer, or other insulating polymer materials. Stress buffer layer 236 is formed over passivation 234 and wafer 230. In one embodiment, stress buffer layer 236 is coated and patterned over a surface of wafer 230. Stress buffer layer 236 includes polyimide, BCB, PBO, epoxy based polymer materials or other insulating buffer materials. Stress buffer layer 236 is patterned to expose contact pads 232.

Adhesion layer 238 is deposited over wafer 230 in a conformal coating and includes Ti, TiW, Ta, TaN, Cr, Al, or another electrically conductive adhesion material. Adhesion layer 238 is electrically connected to contact pads 232. Barrier layer 240 is patterned and deposited over adhesion layer 238 in a conformal coating. Barrier layer 240 includes NiV, CrCu, TaN, TiN, Ni, or other conductive barrier materials. Seed layer 242 is patterned and deposited over barrier layer 240 in a conformal coating. Seed layer 242 includes Al, aluminum alloy, Cu, Au, or other conductive materials. Common voltage bus 244 is formed over seed layer 242. Common voltage bus 244 may be deposited and patterned with selective plating or an etch-back process. In alternative embodiments, different combinations of conductive layers may be deposited between common voltage bus 244 and contact pads 232. For example, barrier layer 240 is optional and may not be included in semiconductor device 229. In a further embodiment, seed layer 242 and common voltage bus 244 include the same electrically conductive material. Passivation 246 is coated and patterned over common voltage bus 244 and wafer 230. Passivation 246 provides physical support and electrical isolation to semiconductor device 229 and includes polyimide, BCB, PBO, epoxy based polymer materials or other electrically insulative materials. Passivation 246 is patterned or etched to expose portions of common voltage bus 244.

Seed layer 248 is formed over the exposed portions of common voltage bus 244 using a PVD, CVD, electrolytic plating, electroless plating, or other deposition process. Seed layer 248 includes Al, Al Alloy, Cu, Au, or other conductive material. Barrier layer 250 is deposited over seed layer 248 and includes Ni, Pd, Pt, or other conductive material. As shown in FIG. 6, both seed layer 248 and barrier layer 250 are deposited within the opening formed in passivation 246. However, in an alternative embodiment, seed layer 248 and barrier layer 250 are deposited to overlap the opening formed in passivation 246.

Bumps 252 are deposited over and electrically connected to barrier layer 250 and seed layer 248. Bumps 252 are deposited over the openings of passivation 246 and include a conductive material. Bumps 252 are formed by a plating process applied to conductive material deposited over seed layer 248.

Figure 7:
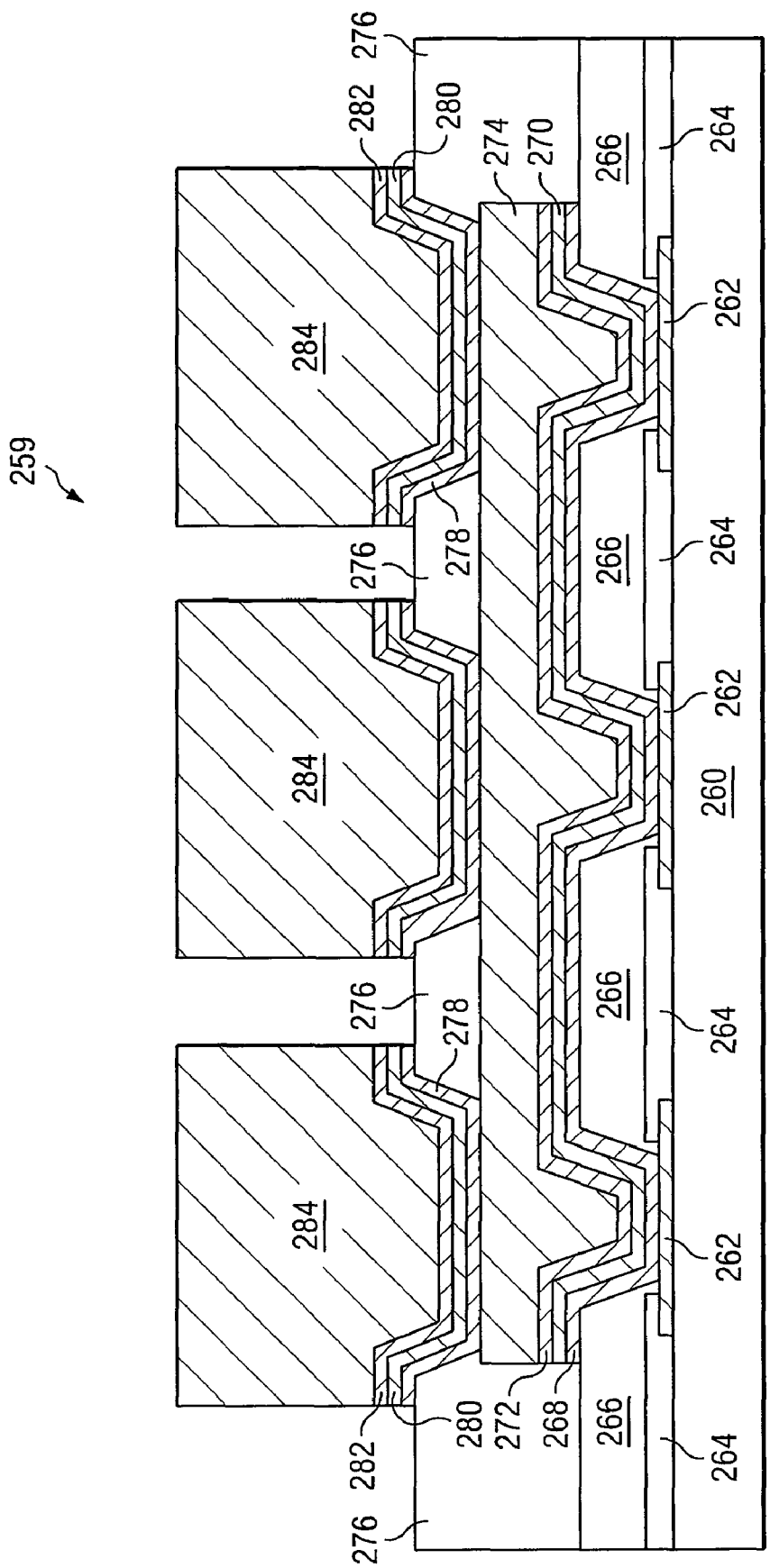
FIG. 7 illustrates a semiconductor device having a common voltage bus formed over a stress buffer layer, interconnect pillars are formed over the common voltage bus.

FIG. 7 illustrates semiconductor device 259 having a common voltage bus formed over a stress buffer layer, interconnect pillars are formed over the common voltage bus. Wafer 260 includes Si, GaAs or other substrate material. In one embodiment, wafer 260 includes an IC power device wafer and includes one or more power circuit elements formed over wafer 260. Contact pads or final metal pads 262 are formed over wafer 260 using a PVD, CVD, electrolytic plating, or electroless plating process. Contact pads 262 are made with a conductive material such as Al, Cu, Sn, Ni, Au, or Ag, and are electrically connected to the circuit elements formed over wafer 260. Passivation 264 is formed over wafer 260 and contact pads 262. Passivation 264 is patterned or etched to expose contact pads 262 and includes an insulation material such as polyimide, BCB, PBO, epoxy based insulating polymer, or other insulating polymer materials. Stress buffer layer 266 is formed over passivation 264 and wafer 260. In one embodiment, stress buffer layer 266 is coated and patterned over a surface of wafer 260. Stress buffer layer 266 includes polyimide, BCB, PBO, epoxy based polymer materials or other insulating buffer materials. Stress buffer layer 266 is patterned to expose contact pads 262.

Adhesion layer 268 is deposited over wafer 260 in a conformal coating and includes Ti, TiW, Ta, TaN, Cr, Al, or another electrically conductive adhesion material. Adhesion layer 268 is electrically connected to contact pads 262. Barrier layer 270 is patterned and deposited over adhesion layer 268 in a conformal coating. Barrier layer 270 includes NiV, CrCu, TaN, TiN, Ni, or other conductive barrier materials. Seed layer 272 is patterned and deposited over barrier layer 270 in a conformal coating. Seed layer 272 includes Al, aluminum alloy, Cu, Au, or other conductive materials. Common voltage bus 274 is formed over seed layer 272. Common voltage bus 274 may be deposited and patterned with selective plating or an etch-back process. In alternative embodiments, different combinations of conductive layers may be deposited between common voltage bus 274 and contact pads 262. For example, barrier layer 270 is optional and may not be included in semiconductor device 259. In a further embodiment, seed layer 272 and common voltage bus 274 include the same electrically conductive material. Passivation 276 is coated and patterned over common voltage bus 274 and wafer 260. Passivation 276 provides physical support and electrical isolation to semiconductor device 259 and includes polyimide, BCB, PBO, epoxy based polymer materials or other electrically insulative materials. Passivation 276 is patterned or etched to expose portions of common voltage bus 274.

Adhesion layer 278 is deposited over common voltage bus 274 over the openings in passivation 276 and includes Ti, TiW, Ta, TaN, Cr, Al, or another electrically conductive adhesion material. Adhesion layer 278 is electrically connected to common voltage bus 274. Barrier layer 280 is patterned and deposited over adhesion layer 278 in a conformal coating. Barrier layer 280 includes NiV, CrCu, TaN, TiN, Ni, or other conductive barrier materials. Seed layer 282 is patterned and deposited over barrier layer 280 in a conformal coating. Seed layer 282 includes Al, aluminum alloy, Cu, Au, or other conductive materials.

Interconnect pillars 284 are deposited over and electrically connected to seed layer 282. Pillars 284 include a conductive material such as Cu or solder and are formed over the openings of passivation 276 using a plating process. In one embodiment, wherein pillars 284 include a Cu material, an additional layer of solder is deposited over pillars 284 to further enhance the electrical connection with external system components. Because pillars 284 include relatively thick conductive structures, pillars 284 facilitate the removal of heat energy from common voltage bus 274, further minimizing residue stresses within semiconductor device 259.

FIGS. 8a-8f illustrate a method of manufacturing semiconductor device 299 having a wire bondable metallization for forming electrical interconnects. Wafer 300 includes Si, GaAs or other substrate material. Circuit elements are formed over wafer 300. The circuit elements may be active or passive and include resistors, capacitors, transistors, and inductors. The circuit elements are made up of patterned conductive, resistive, and dielectric layers and are formed using wafer-level fabrication processes as described above. In one embodiment, wafer 300 includes an IC power device wafer and includes one or more power circuit elements formed over wafer 300. Contact pads 302 are formed over wafer 300 using a PVD, CVD, electrolytic plating, or electroless plating process. Contact pads 302 are made with a conductive material such as Al, Cu, Sn, Ni, Au, or Ag, and are electrically connected to the circuit elements formed over wafer 300. Passivation 304 is formed over wafer 300 and contact pads 302. Passivation 304 is patterned or etched to expose contact pads 302 and includes an insulation material such as silicon nitride (SiN), polyimide, BCB, PBO, epoxy based insulating polymer, or other insulating polymer materials. Passivation 304 provides physical support and electrical insulation. Adhesion layer 306 is deposited over passivation 304 using a PVD, CVD, electrolytic plating, or electroless plating process. Adhesion layer 306 includes TiW, Ti, Cr, Ta, TaN, or other conductive adhesion layer materials and is formed in electrical contact with contact pads 302. Seed layer 308 is deposited over adhesion layer 306 using a PVD, CVD, electrolytic plating, or electroless plating process. Seed layer 308 includes Cu, Al, Au, or other conductive materials.

Figure 8A:
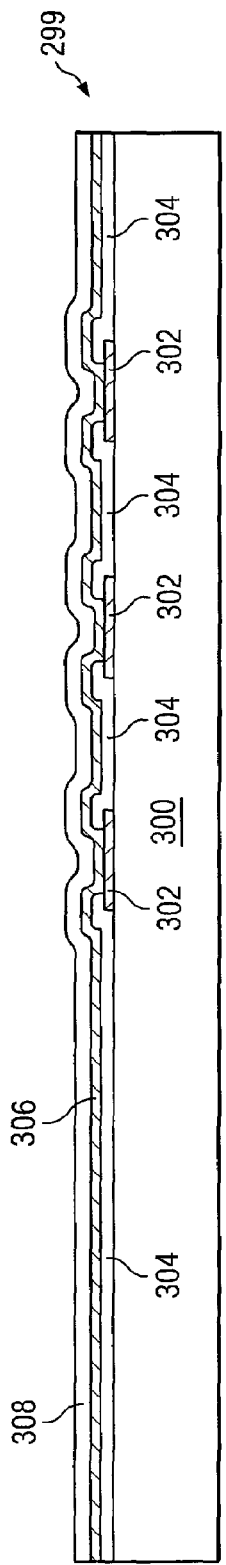
FIGS. 8a-8f illustrate a method of manufacturing a semiconductor device having a wire bondable metallization for forming electrical interconnects.
Figure 8B:
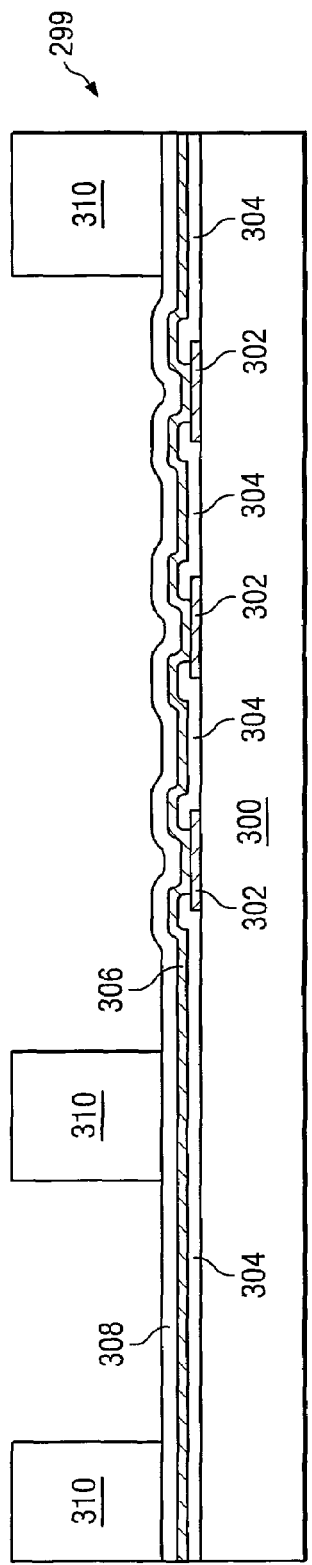
Figure 8C:
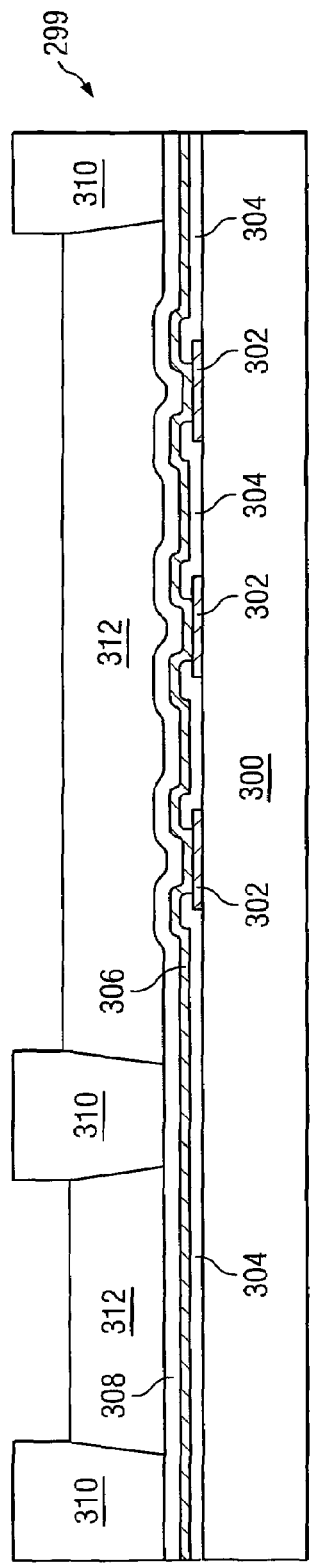

Turning to FIG. 8b, a layer of photoresist 310 is deposited and patterned over seed layer 308 and wafer 300. As shown in FIG. 8c, metal layer 312 is selectively plated over seed layer 308 around photoresist 310. In one embodiment, metal layer 312 is deposited during the lower-cost wafer bumping process. Metal layer 312 includes a conductive material such as Cu, or Au and has a typical thickness greater than 3 micrometers (μm) between 8 μm and 20 μm. In one embodiment, the thickness of metal layer 312 is approximately 15 μm. In another embodiment, metal layer 312 includes a large area common voltage bus formed over a surface of wafer 300. In some embodiments, the thickness of metal layer 312 is approximately 100 μm.

Figure 8D:
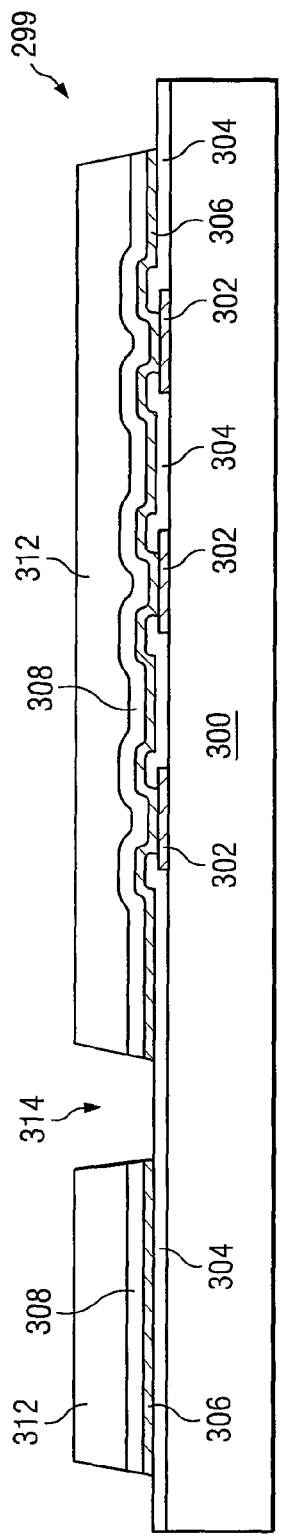

Turning to FIG. 8d, photoresist 310 is stripped and removed. After photoresist 310 is removed, metal layer 312 is used as a mask to remove portions of seed layer 308 and adhesion layer 306 to form channels 314. After the portions of seed layer 308 and adhesion layer 306 are removed, channels 314 expose a portion of passivation 304, as shown in FIG. 9.

Figure 8E:
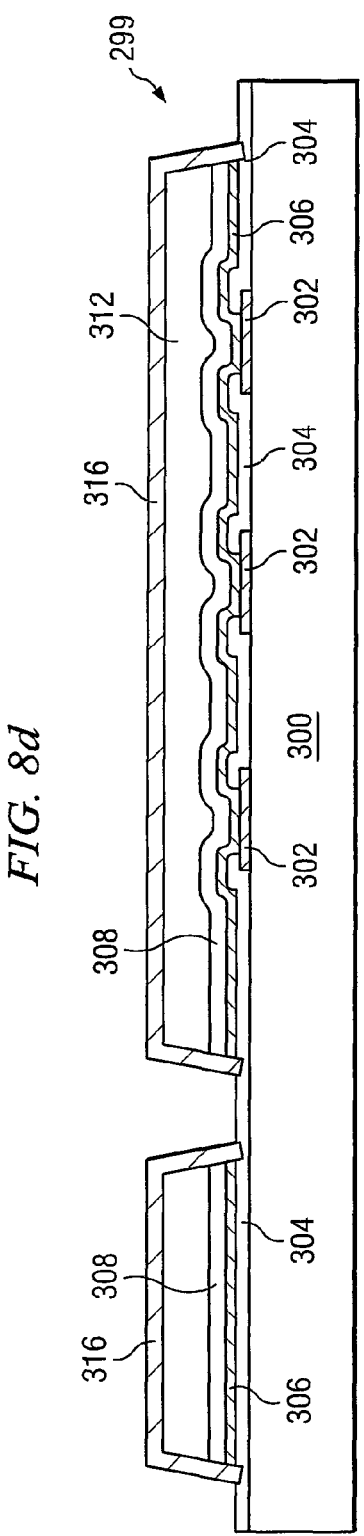

Turning to FIG. 8e, wirebondable layer 316 is patterned and deposited over wafer 300 in an approximately conformal layer. Wirebondable layer 316 includes one or more layers of conductive material for attaching wirebonds. In one embodiment, wirebondable layer 316 includes multiple layers of conductive material such as a combination of Ni and Au materials. Alternatively, wirebondable layer 316 includes a single layer of conductive material such as a single layer of Ag or Au. In one embodiment, wirebondable layer 316 is deposited before removal of photoresist 310 to improve surface finishing and avoid plating chemistry that breaks down the surface of passivation 304.

Figure 8F:
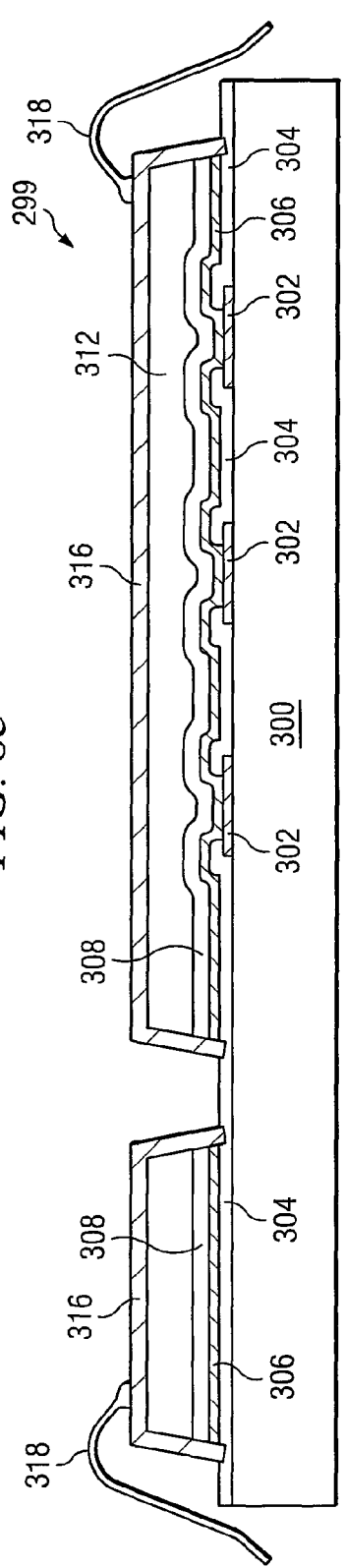

Turning to FIG. 8f, wirebonds 318 are formed and connected to wirebondale layer 316. Wirebonds 318 include a conductive material such as Cu, Al, Au, or Ag and form a physical and electrical connection between wirebondable layer 316 and other system components. By connecting wirebonds 318 to wirebondable layer 316 rather than specific wirebond pads, the tolerance for wirebond 318 placement is increased.

Figure 9:
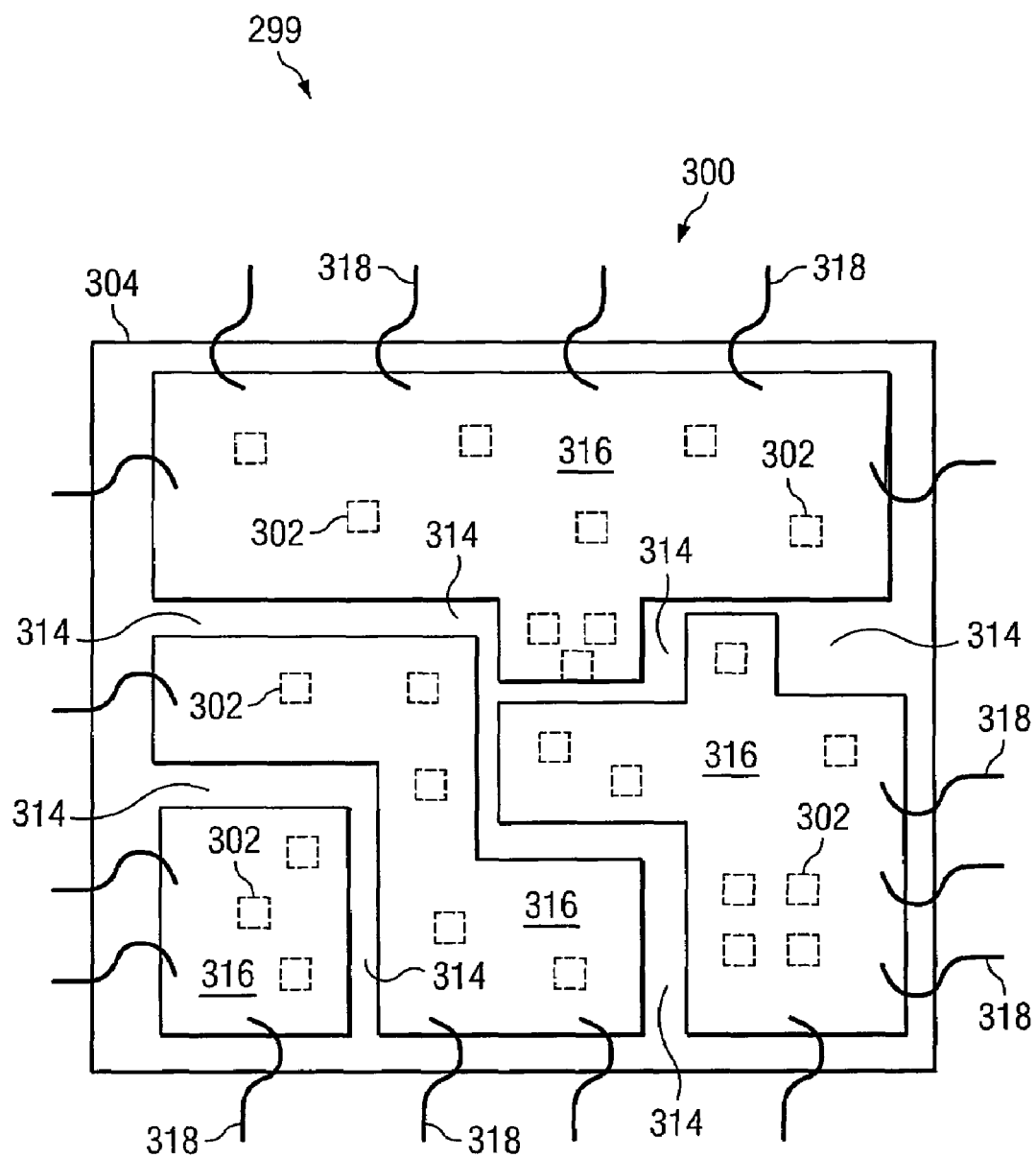
FIG. 9 illustrates a top view of the semiconductor device of FIG. 8f.

FIG. 9 illustrates a top view of semiconductor device 299. Semiconductor device 299 includes passivation layer 304 formed over wafer 300. Passivation layer 304 includes an insulation material such as SiN, polyimide, BCB, PBO, epoxy based insulating polymer, or other insulating polymer materials. Passivation 304 provides physical support and electrical insulation. Wirebondable layer 316 is formed over wafer 300 in electrical contact with contact pads 302 formed over a surface of wafer 300. Channels 314 are formed in wirebondable layer 316 to electrically isolate different regions of wirebondable layer 316. Contact pads 302 are shown with dashed lines on FIG. 9 as they are formed beneath wirebondable layer 316. Wirebonds 318 are formed between external system components and wirebondable layer 316.

Using the present methods a semiconductor device is fabricated having improved performance and a cheaper manufacturing process. The device does not include conventional peripheral contact pads which require expensive and time-consuming manufacturing processes and which result in an unnecessarily large package and die footprint. Instead, the device includes a redistributed thick metallized layer having a wirebondable surface. No final passivation or rerouted peripheral input/output pads are formed. By connecting wirebonds directly to the thick metallized layers, a smaller package footprint is created with greater interconnection flexibility, lower RC delay and a less-expensive manufacturing process. In one example, the geometry of the metallized surface is configured for specific power device applications and may vary from a typical thickness of 3 µm up to approximately 100 µm.

FIG. 10 illustrates semiconductor device 399 with a wirebondable layer formed over a top surface of a main metallization layer. Wafer 400 includes Si, GaAs or other substrate material. In one embodiment, wafer 400 includes an IC power device wafer and includes one or more power circuit elements formed over wafer 400. Contact pads 402 are formed over wafer 400 using a PVD, CVD, electrolytic plating, or electroless plating process. Contact pads 402 are made with a conductive material such as Al, Cu, Sn, Ni, Au, or Ag, and are electrically connected to the circuit elements formed over wafer 400. Passivation 404 is formed over wafer 400 and contact pads 402. Passivation 404 is patterned or etched to expose contact pads 402 and includes an insulation material such as SiN, polyimide, BCB, PBO, epoxy based insulating polymer, or other insulating polymer materials. Adhesion layer 406 is deposited over passivation 404 using a PVD, CVD, electrolytic plating, or electroless plating process. Adhesion layer 406 includes TiW, Ti, Cr, Ta, TaN, or other conductive adhesion layer materials and is formed in electrical contact with contact pads 402. Seed layer 408 is deposited over adhesion layer 406 using a PVD, CVD, electrolytic plating, or electroless plating process. Seed layer 408 includes Cu, Al, Au, or other conductive materials. Metal layer 410 is selectively plated over seed layer 408. Metal layer 410 includes a conductive material such as Cu, or Au and has a typical thickness greater than 3 µm. In one embodiment, the thickness of metal layer 410 is approximately 15 µm.

Wirebondable layer 412 is patterned and deposited over wafer 400 using a PVD, evaporation or electroless/electrolytic plating process. In one embodiment, photoresist is first applied to control the deposition and patterning of wirebondable layer 412. Wirebondable layer 412 includes one or more layers of conductive material for attaching wirebonds such as Ni-phosphorous (P)/Pd/Au, Ni—P/Au, Ti/TiN/Al, Al/Cu, or Ag. In one embodiment, wirebondable layer 412 includes multiple layers of conductive material such as a combination of Ni and Au materials. Alternatively, wirebondable layer 412 includes a single layer of conductive material such as Ag or Au. Wirebonds 414 are formed and connected to wirebondale layer 412. Wirebonds 414 include a conductive material such as Cu, Al, Au, or Ag and form a physical and electrical connection between wirebondable layer 412 and other system components.

FIG. 11 illustrates semiconductor device 499 having a main metallization layer that is used as a bondable surface for wirebonds. Wafer 500 includes Si, GaAs or other substrate material. In one embodiment, wafer 500 includes an IC power device wafer and includes one or more power circuit elements formed over wafer 500. Contact pads 502 are formed over wafer 500 using a PVD, CVD, electrolytic plating, or electroless plating process. Contact pads 502 are made with a conductive material such as Al, Cu, Sn, Ni, Au, or Ag, and are electrically connected to the circuit elements formed over wafer 500. Passivation 504 is formed over wafer 500 and contact pads 502. Passivation 504 is patterned or etched to expose contact pads 502 and includes an insulation material such as SiN, polyimide, BCB, PBO, epoxy based insulating polymer, or other insulating polymer materials. An optional adhesion layer 506 and seed layer 508 are deposited over passivation 504 using a PVD, CVD, electrolytic plating, or electroless plating process. Adhesion layer 506 includes TiW, Ti, Cr, Ta, TaN, or other conductive adhesion layer materials and is formed in electrical contact with contact pads 502. Seed layer 508 is deposited over adhesion layer 506 using a PVD, CVD, electrolytic plating, or electroless plating process. Seed layer 508 includes Cu, Al, Au, or other conductive materials. Metal layer 510 is selectively plated over seed layer 508. Metal layer 510 includes a conductive material such as Cu, or Au and has a typical thickness greater than 3 µm. In one embodiment, the thickness of metal layer 510 is approximately 15 µm. Wirebonds 512 are formed and connected to metal layer 510. Wirebonds 512 include a conductive material such as Cu, Al, Au, or Ag and form a physical and electrical connection between metal layer 510 and other system components.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:

providing a wafer including a plurality of semiconductor dies and plurality of contact pads formed over a surface of the wafer;

forming a passivation layer over the wafer and patterning the passivation layer to expose the contact pads;

forming an adhesion layer over the passivation layer;

forming a seed layer over the adhesion layer, the seed layer electrically connected to the contact pads;

depositing a photoresist as a pattern over the seed layer;

plating a metal layer within the pattern of the photoresist over the seed layer to form a plurality of regions of the metal layer each separated and arranged by the pattern in the photoresist to be disposed over and electrically connected as a plurality of common voltage busses to respective groups of the contact pads;

removing the photoresist to form a channel between the regions of the metal layer extending to the seed layer;

removing a portion of the seed layer and the adhesion layer within the channel to expose a portion of the passivation layer and electrically isolate the regions of the metal layer;

depositing a wirebondable layer over each of the electrically isolated regions of the metal layer and into the channel extending to the passivation layer after removing the photoresist; and connecting a plurality of wirebonds to the wirebondable layer.

2. The method of claim 1, wherein the wirebondable layer includes multiple layers of conductive material.

3. The method of claim 1, wherein the wirebondable layer is deposited as a conformal coating.

4. The method of claim 1, wherein a thickness of the metal layer is greater than 3 micrometers.

5. A method of making a semiconductor device, comprising:

providing a semiconductor die including a plurality of contact pads formed over a surface of the semiconductor die;

forming an insulating layer over the surface of the semiconductor die;

forming a first conductive layer over the insulating layer, the first conductive layer electrically connected to the contact pads of the semiconductor die;

depositing a photoresist as a pattern over the first conductive layer;

forming a second conductive layer within the pattern of the photoresist over the first conductive layer to form a plurality of regions of the second conductive layer each separated and arranged by the pattern in the photoresist to be disposed over and electrically connected as a plurality of common voltage busses to respective groups of the contact pads of the semiconductor die;

removing the photoresist to form a channel between the regions of the second conductive layer extending to the first conductive layer;

removing a portion of the first conductive layer within the channel to expose a portion of the insulating layer and electrically isolate the regions of the second conductive layer;

depositing a wirebondable layer over each of the electrically isolated regions of the second conductive layer after removing the photoresist; and connecting a plurality of wirebonds to the wirebondable layer.

6. The method of claim 5, wherein the second conductive layer includes aluminum or aluminum alloy.

7. The method of claim 5, wherein the second conductive layer includes multiple layers of conductive material.

8. The method of claim 5, further including depositing the wirebondable layer as a conformal coating.

9. The method of claim 5, wherein a thickness of the second conductive layer is greater than 3 micrometers.

10. A semiconductor device, comprising:

a semiconductor die including a plurality of contact pads formed over a surface of the semiconductor die;

a first conductive layer formed over the surface of the semiconductor die and electrically connected to the contact pads of the semiconductor die;

a second conductive layer formed over the first conductive layer as a plurality of electrically isolated regions disposed over and electrically connected as a plurality of common voltage busses to respective groups of the contact pads of the semiconductor die;

a channel formed between the electrically isolated regions of the second conductive layer;

a wirebondable layer deposited over the second conductive layer and extending into the channel; and a plurality of wirebonds electrically connected to the wirebondable layer.

11. The semiconductor device of claim 10, including:

an insulating layer formed over the semiconductor die and patterned to expose the contact pads; and a third conductive layer formed over the insulating layer.

12. A semiconductor device, comprising:

a wafer including a plurality of semiconductor dies and a plurality of contact pads disposed over a surface of the wafer;

a passivation layer disposed over the wafer and patterned to expose the contact pads;

an adhesion layer disposed over the passivation layer;

a seed layer disposed over the adhesion layer and electrically connected to the contact pads;

a metal layer formed over the seed layer as a plurality of electrically isolated regions disposed over and electrically connected as a plurality of common voltage busses to respective groups of the contact pads of each of the semiconductor dies;

a channel formed between the electrically isolated regions of the metal layer to expose a portion of the passivation layer;

a wirebondable layer disposed over the metal layer and into the channel over sidewalls of the electrically isolated regions of the metal layer; and a plurality of wirebonds electrically connected to the wirebondable layer.

13. The semiconductor device of claim 12, wherein the wirebondable layer comprises multiple layers of conductive material.

14. The semiconductor device of claim 12, wherein the wirebondable layer comprises a conformal coating.

15. The semiconductor device of claim 12, further comprising a stress buffer layer disposed over the passivation layer, the stress buffer layer patterned to expose the contact pads.

16. The semiconductor device of claim 12, wherein a thickness of the metal layer is greater than 3 micrometers.

17. A method of making a semiconductor device, comprising:

providing a semiconductor wafer including a plurality of semiconductor dies and a plurality of contact pads formed over a surface of the semiconductor wafer;

forming a first conductive layer over the semiconductor wafer;

forming a second conductive layer over the first conductive layer during a wafer bumping process as a plurality of electrically isolated regions of the second conductive layer disposed over and electrically connected as a plurality of common voltage busses to respective groups of the contact pads, wherein each of the plurality of semiconductor dies comprises at least two groups of contact pads;

depositing a wirebondable layer over each of the electrically isolated regions of the second conductive layer; and forming a plurality of wirebonds over the wirebondable layer.

18. The method of claim 17, further including:

forming an insulating layer over the surface of the semiconductor dies prior to forming the first conductive layer;

depositing a photoresist as a pattern over the first conductive layer;

forming the second conductive layer within the pattern of the photoresist over the first conductive layer;

removing the photoresist to form a channel between the electrically isolated regions of the second conductive layer extending to the first conductive layer;

removing a portion of the first conductive layer within the channel to expose a portion of the insulating layer; and depositing the wirebondable layer over each of the electrically isolated regions of the metal layer and into the channel extending to the insulating layer after removing the photoresist.

19. The method of claim 17, wherein the wirebondable layer includes multiple layers of conductive material.

20. The method of claim 17, further including depositing the wirebondable layer as a conformal coating.

21. The method of claim 17, wherein a thickness of the second conductive layer is greater than 3 micrometers.

* * * * *